United States Patent [19]

Cusack

[11] Patent Number: 4,711,700

[45] Date of Patent: Dec. 8, 1987

[54] METHOD FOR DENSIFYING LEADFRAME CONDUCTOR SPACING

[75] Inventor: Michael D. Cusack, Monument, Colo.

[73] Assignee: United Technologies Corporation, Hartford, Conn.

[21] Appl. No.: 861,208

[22] Filed: May 8, 1986

Related U.S. Application Data

[62] Division of Ser. No. 751,637, Jul. 3, 1985, abandoned.

[51] Int. Cl.⁴ ............................. C23F 1/02; B44C 1/22
[52] U.S. Cl. ...................................... 156/651; 29/827; 156/634; 156/656; 156/661.1; 156/901; 357/70; 357/72; 361/421; 439/72
[58] Field of Search ............... 156/634, 651, 654, 656, 156/659.1, 661.1, 901; 29/576 S, 827; 357/70, 72; 339/17 R, 17 B, 17 N; 361/404–406, 408, 421; 174/68.5

[56] References Cited

U.S. PATENT DOCUMENTS 3,440,027  4/1969  Hugle ............................. 174/68.5 X
3,795,044  3/1974  Peltz ...................................... 29/591

Primary Examiner—William A. Powell
Attorney, Agent, or Firm—Dominic J. Chiantera

[57] ABSTRACT

A leadframe assembly comprises a plurality of bifurcated leads, each characterized by an inner lead end region adapted for connection to the die bond pads and an outer lead end region adapted for connection to external circuitry.

3 Claims, 12 Drawing Figures

METHOD FOR DENSIFYING LEADFRAME CONDUCTOR SPACING

This is a division of application Ser. No. 751,637 filed on July 3, 1985, now abandoned.

TECHNICAL FIELD

This invention relates to integrated circuits, and more particularly to the packaging of integrated circuit (IC) dies.

BACKGROUND ART

In plastic encapsulated integrated circuit (IC) packages the die is wire bonded, or connected by a tape automated bonding (TAB) process, to a metal leadframe which connects the die input/output (I/O) bonding pads to external electrical circuitry. The leadframe includes a plurality of spaced apart electrical conductors, or leads arrayed in a pattern. The leads are typically copper or iron-nickel alloy. The lead outer ends are formed integrally with a frame tie-bar at the time of manufacture, and they radiate inwardly in a central direction. The inner ends of the leads are more or less in register with, or at least in proximity to, associated ones of the die bonding pads. The gap, or spacing between leads at the outer end is limited by the dimensions of the package, while the inner end gap is defined by the die bonding pads.

The increasing density of the IC dies (gates per square inch) requires a corresponding decrease in the spacing of I/O pads making the required inner lead spacing increasingly smaller. Typically the leadframe is produced by stamping the pattern from blank metal foil or by etching, using photolithographic processes. As inner lead spacing becomes smaller both methods are limited in their ability to provide a minimum gap dimension.

Stamping produces a minimum gap value approximately equal to the thickness of the base material, due to displacement of the stamped material. In addition, with finer frame patterns stamping may induce strains in the leads which can cause lead fracture. This, in turn, causes IC failure. Finer lead spacing also requires higher precision stamping tools, so that tool wear and breakage become more serious.

Etching does not produce the lead strain that occurs with stamping, however, minimum gap dimension is also dependent on the base material thickness. A chemical etchant dissolves material laterally as well as normal to the surface, so that single side etching of a base material of thichness T produces a minimum aperture diameter of 2T. For a 0.008 inch (0.203 mm) thick copper leadframe, single side etching produces a minimum gap of 0.016 inches (0.406 mm).

U.S. Pat. No. 4,389,279 to Weber et al. discloses a method of etching a metallic strip simultaneously from both sides to produce a color television shadow mask, whereby the mask apertures can be controlled to a minimum diameter equal to the strip thickness. Therefore, simultaneous etching of both sides to a depth of T/2 produces a minimum aperture of T. As a result etching, as with stamping, limits an etched aperture minimum diameter to a value approximately equal to the base material thickness. Since frame thickness determines frame mechanical strength, there is a trade-off between strength and gap spacing requirements. A leadframe with a material thickness of 0.008 inch (0.203 mm) for sufficient strength, is limited to inner lead end gaps of 0.008 inches, which may be too great for very large scale integrated (VLSI) IC's.

DISCLOSURE OF INVENTION

The object of the present invention is to provide a leadframe assembly with inner lead end gap dimensions smaller than the conductor thickness required for desired mechanical strength. Another object of the present invention is to provide a method of fabricating such a leadframe assembly.

According to the present invention, a leadframe assembly comprises a plurality of bifurcated leads, each characterized by an inner lead end region adapted for connection to the die bond pads and an outer lead end region adapted for connection to external circuitry, wherein the material thickness of the outer end region is selected to provide leadframe strength and the inner end region is selected to provide minimum gap dimensions between inner ends of adjacent leads. In further accord with the present invention, the inner end region has a material thickness less than that of the outer end region.

The leadframe assembly of the present invention provides for increased density of conductors, with closer spaced lead connection to the die. This is achieved by providing bifurcated conductors with different thickness. The inner end region has a thickness less than the outer end region to permit the inner ends of the conductors to be in register with closely spaced bonding pads of the die. The outer region typically includes a base material thickness on the order of 0.008 inches to provide structural strength, while the inner region conductor thickness is 0.002 inches. This allows inner lead gap spacing on the order of 0.002 inches (0.051 mm).

These and other objects, features and advantages of the present invention will become more apparent in light of the following detailed description of a best mode embodiment thereof.

BEST MODE FOR CARRYING OUT THE INVENTION

Figure 1:
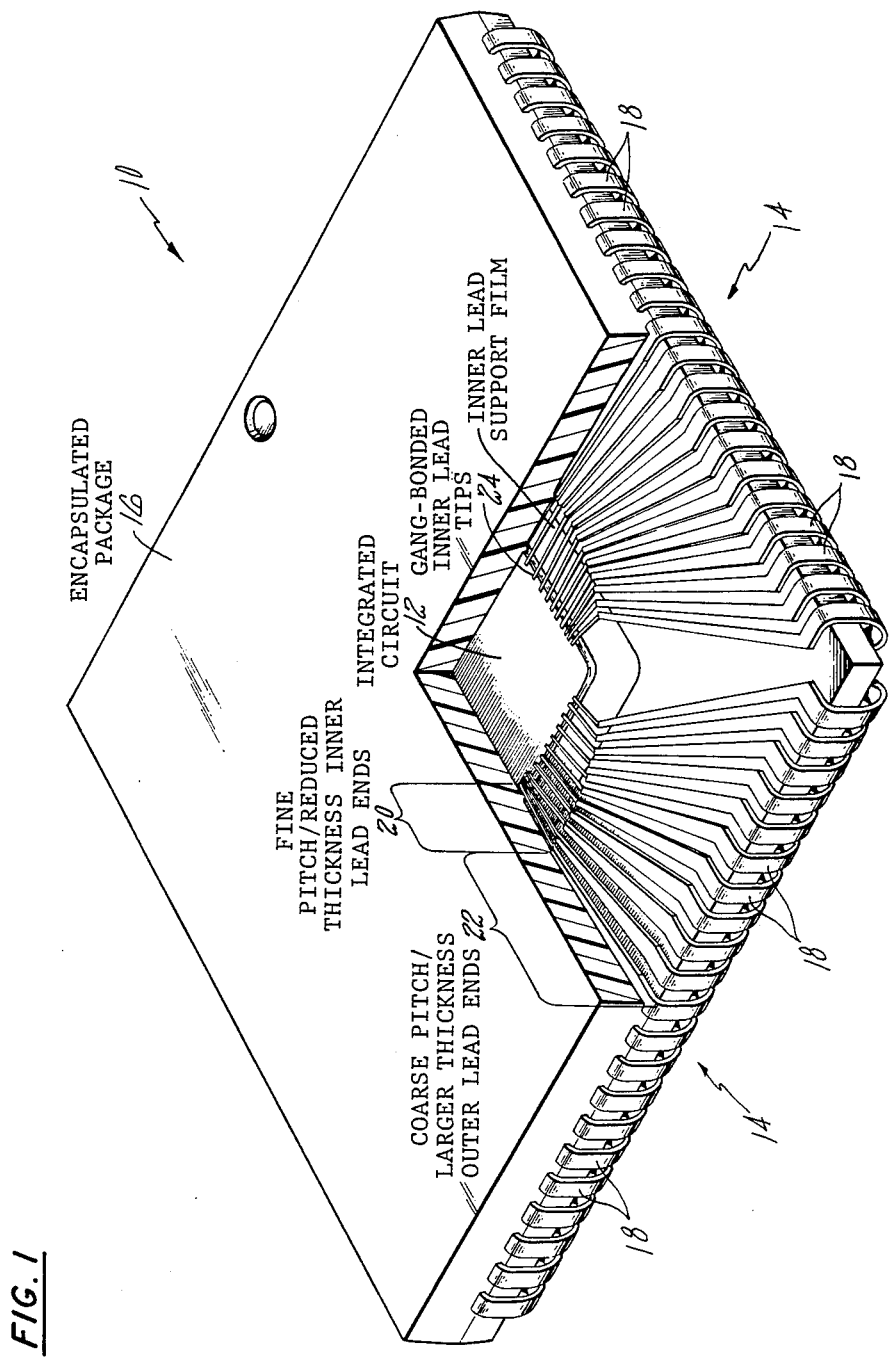
FIG. 1 is an isometric, partially cutaway illustration of a plastic encapsulated IC die.

FIG. 1 illustrates, in partial cutaway, the completed assembly 10 of an encapsulated integrated circuit (IC)

12. The IC bonding pads are bonded to the inner ends of individual conductors of a leadframe assembly 14, and the IC and leadframe are sealed within an encapsulating plastic package 16. The leadframe conductors are shown generally by reference numeral 18, and in FIG. 1 are shown distributed in four quadrants along the four sides of the package. It should be understood, however, that the present invention is not limited to a particular leadframe package or geometry. Instead, the present invention may be used with various other IC configurations requiring other than four sides interconnections, e.g. six sided package.

The leadframe conductor pattern is defined by the conductor gap (open spacing between adjacent leads), pitch (centerline to centerline spacing between adjacent leads) width, and thickness. In the present invention the leadframe assembly is bifurcated into a fine pitch, inner lead end region 20 and a coarse pitch, outer lead end region 22. The necessary inner lead gap value is determined by the IC bond pad spacing. The outer end gap value is determined by standardized package interconnect dimensions.

Figure 2:
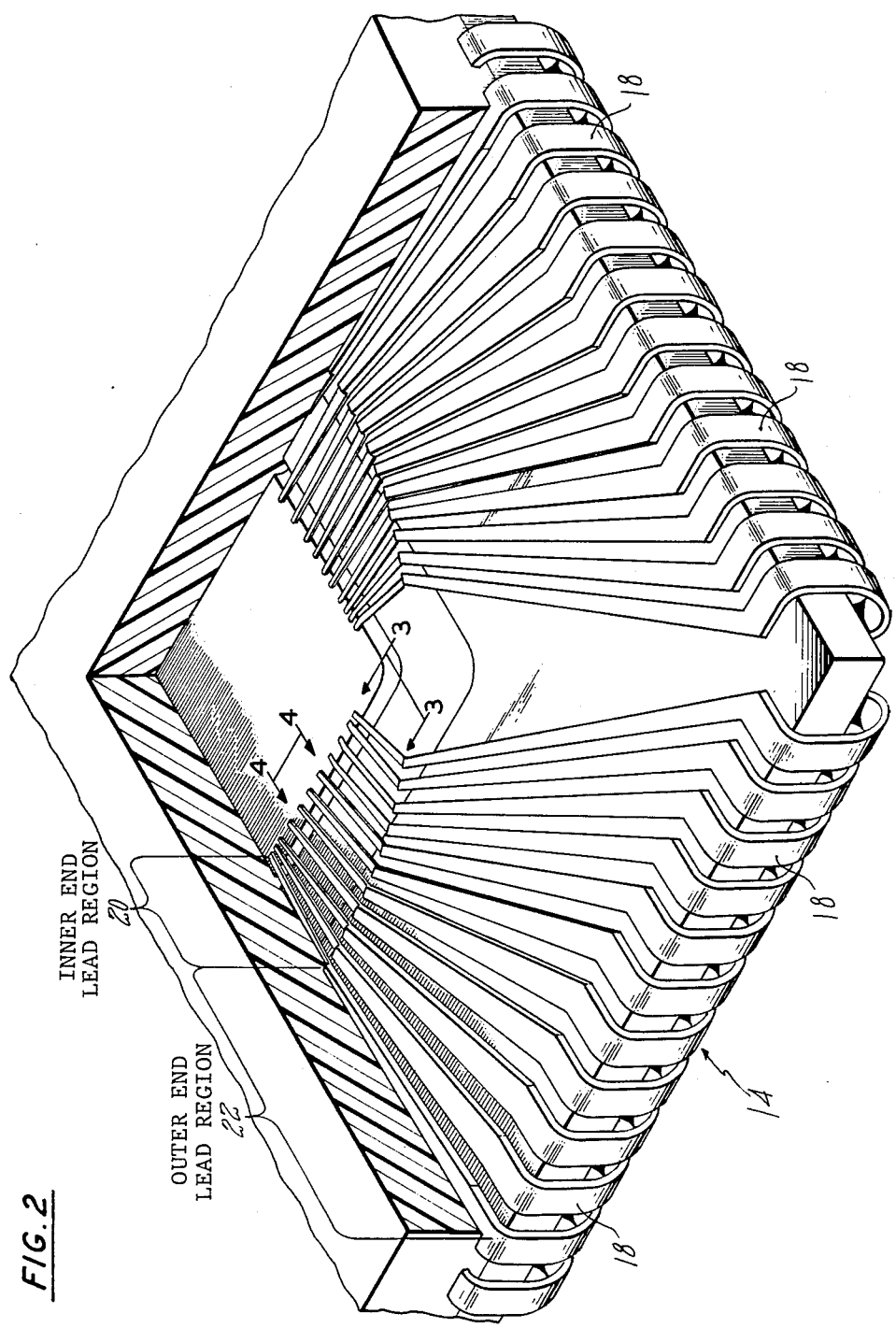
FIG. 2 is an isometric view of a simplified leadframe assembly according to the present invention, and which is used in the description of the invention.

FIG. 2 is a close-up view of the cutaway portion of FIG. 1. The leadframe conductor segments are again shown as including an inner lead region 20 and outer lead region 22. In a typical embodiment the base material is copper, and the outer end region thickness is 0.008 inches (0.203 mm) to provide sufficient lead strength. The inner lead region conductor is at a thickness approximately one-quarter that of the outer end region, or 0.002 (0.051 mm). The leadframe pattern is provided by etching copper foil using masks which define the gap, pitch and width array geometry. By use of the two step etching process described hereinafter the inner end region is thinned to produce the smaller thickness. As a result, the achievable minimum inner end gap dimension is much less than the outer end gap.

Figures 3, 4:
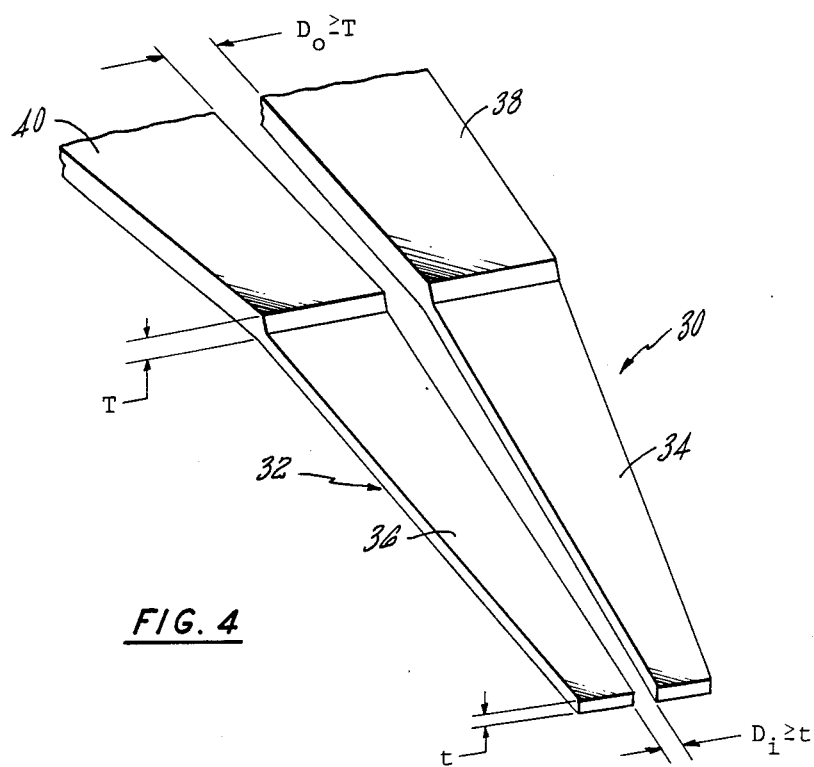
FIG. 3 is a section view taken along the lines 3—3 of FIG. 2.
FIG. 4 is a partial, isometric view taken along the line 4—4 of FIG. 2.

FIG. 3 is a planar view of a section of one of the leadframe conductors, taken along the line 3—3 of FIG. 2. In the sectional view of a typical conductor 28 the outer end region thickness is T and the inner end region thickness is t, which is nominally one-quarter the value of T.

FIG. 4 is a partial isometric view taken along the line 4—4 of FIG. 2. It illustrates two adjacent conductors 30, 32 with inner end lead portions 34, 36 and outer end lead portions 38, 40 with base material thickness t and T, respectively. The gap spacing between the inner lead ends 34, 36 is $D_i$, which is greater than or equal to t. Similarly, $D_o$ is the gap for the outer end regions 38, 40, and is greater than or equal to T. The dimensions are not shown to scale.

The preferred manufacturing method for the present leadframe assembly is etching, using known photolithographic techniques, but which involves a novel two step, two side etching process to achieve the bifurcated lead geometry. As known, the process of etching a base material from both sides allows the minimum etched aperture diameter to be equal to the base material thickness. FIGS. 5–8 illustrate the two step etching process with respect to a simple sixteen leadframe pattern. Illustrations A, B in each Figure show the top and bottom major surfaces, respectively.

Figure 5A:
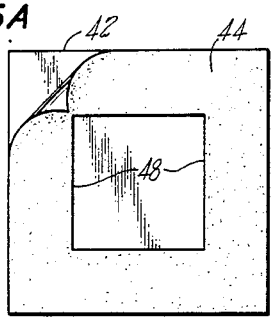
FIGS. 5A, B are planar views of the major surfaces of a leadframe assembly illustrated in an initial step of manufacture.
Figure 5B:
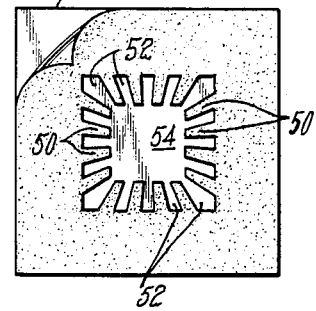

FIG. 5 illustrates a leadframe assembly blank foil 42, with the top surface (FIG. 5A) coated with a photoresist pattern 44 and the bottom surface (FIG. 5B) coated with photoresist pattern 46. The material may be copper or iron-nickel alloy. Each of the photoresist patterns (shown by the darkened, or stippled areas) may be deposited by any one of a number of well known photolithographic processes. Briefly, the two surfaces are coated with photosensitive emulsion. A photographic negative of the desired leadframe pattern (number of conductors and conductor pitch, width, and gap) is superimposed on the emulsion and the combination is exposed to ultraviolet light. The ultraviolet exposure hardens the photo emulsion and the plate is then placed in alcohol to dissolve the unexposed emulsion.

With respect to pattern geometry, the top surface photoresist pattern 44 (FIG. 5A) is coextensive with the leadframe outer end region 22 (FIGS. 1, 2). The uncoated central portion 48 includes both the inner end region 20 (FIGS. 1, 2) and also the central cut-out area occupied by the die (12, FIGS. 1, 2). The bottom surface photoresist pattern 46 (FIG. 5B) covers both the outer end region 22, in register with the pattern 44, and further defines the inner end lead pattern, shown generally by reference numeral 50. The uncoated areas include the inner end gaps 52, and die cut-out 54. The perimeter of the uncoated area (defined by the gap outermost edge) ideally is in register with the uncoated area 48 of the top surface pattern 44.

Following masking, both sides of the blank foil are etched simultaneously using known etching methods. The etching time exposure is limited to that interval sufficient to remove approximately one-quarter of the exposed surface material on each side. For a 0.008 inch (0.203 mm) thick foil, approximately 0.002 inches (0.051 mm) of the exposed surface area material is removed from each side. The coated areas are unaffected. Following the first step etching process the outer end region 20 is not etched at all, whereas the inner end region is pattern etched from the bottom side (FIG. 5B) as a result of the pattern 46, and mass etched within the exposed area 48 on the top side (FIG. 5A). The partially etched foil is then washed.

Figure 6A:
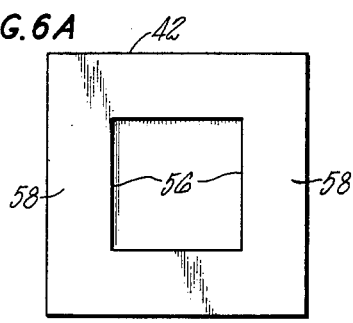
FIGS. 6A, B are planar illustrations of the two major surfaces of FIGS. 5A, B at a subsequent step of manufacture of the present leadframe assembly.
Figure 6B:
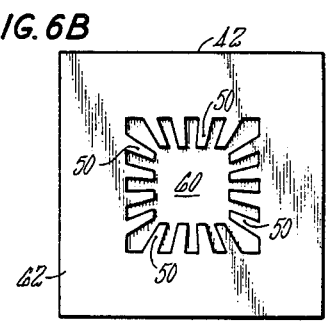

FIGS. 6A, B illustrate the partially etched top and bottom surfaces. The pre-etched exposed area 48 (FIG. 5A) comprises a post-etched cavity 56, which is approximately square with an approximate depth of one-quarter the base material thickness; 0.002 inches (0.051 mm) for a 0.008 inch (0.203 mm) thick foil. The region 58 corresponding to the outer end region 20 of the completed leadframe, remains essentially the same. The bottom side surface (FIG. 6B) similarly includes the patterned cavity 60 in which the conductor inner ends 50 appear as "peninsulars", projecting into the cavity from the surface 62. The surface 62 is in register with the surface 58 of the top side.

Figure 7A:
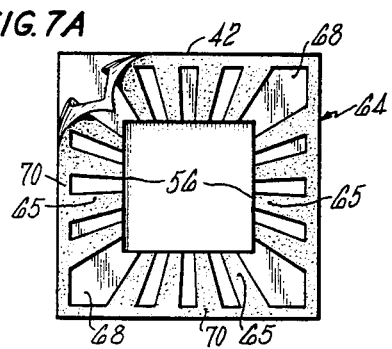
FIGS. 7A, B are planar illustrations of the two major surfaces of FIGS. 6A, B shown at still a further step of fabrication.
Figure 7B:
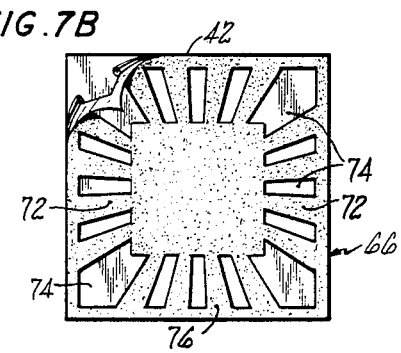

In the second etching step, the workpiece is again coated with photoresist, pattern masked, and exposed to ultraviolet light to provide the hardened photoresist patterns 64 on the top side (FIG. 7A) and 66 on the bottom side (FIG. 7B). The area of the cavity 56 on the top side is exposed as are the gaps 68 in the previously non-etched surface region 58 (FIG. 6A). The pattern defines the geometry of the outer ends 65 of the leadframe conductors; each tied together at their outer end to a common tie-bar portion 70.

The bottom surface pattern 66 is essentially identical to the top surface pattern 64, with the exception that the central region comprising the cavity 60 (which is in register with the cavity 56 on the top side) is coated with photoresist. The pattern 66 includes the conductor outer end lead geometry 72, the outer end gaps 74, and tie-bar region 76; each in register with the corresponding lead, gap, and tie-bar geometries 65, 68, 70 of the top side pattern (FIG. 7A).

The masked foil is again exposed to simultaneous etching of both sides. In this second step the etching time interval is increased to a value established as that required to remove approximately 50% of the base material from each side, i.e. sufficient to etch through the foil. This extended etching interval allows the exposed outer end gaps 68 (FIG. 7A) and 74 (7B) which were previously not etched, to etch completely through the blank, providing the outer end aperture gaps of the final leadframe pattern. Also, in the second etching step, the area of the cavity 56 on the top side that was previously etched to a depth of approximately one-quarter of the base material thickness, or 0.002 inch, is etched a second time, to cause an additional 50% of the base material to be removed. In the area of the previously etched cavity 60 on the bottom side, all of the remaining material is thus completely removed, thereby providing the inner end gaps of the final leadframe pattern.

Figure 8A:
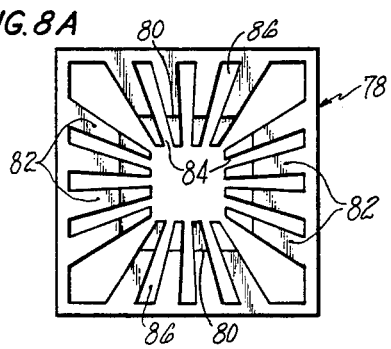
FIGS. 8A, B are planar views of the two major surfaces of a completed leadframe assembly according to the present invention.
Figure 8B:
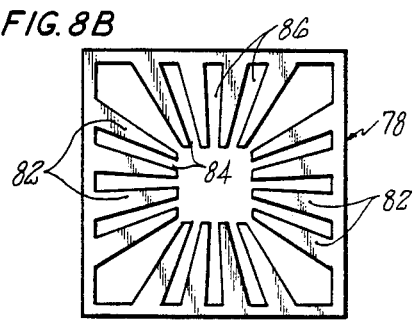

FIG. 8 shows the completed leadframe assembly 78. The top surface (FIG. 8A) includes the stepped profile 80 of the bifurcated conductors 82. As shown the inner end gaps 84 are less than the outer end gaps 86.

While the process of simultaneous etching of both sides of the foil using the two step process described above, represents the preferred method of manufacture, an alternative two step stamping process may also be used. In the stamping process the inner end region and die cut-out portion is first thinned by "coining" the area using known techniques. The coining step produces an inner end region having an approximate thickness equal to one-quarter the remaining foil thickness. The coined blank is then pattern stamped to provide the final conductor patterned array. The thinned inner end region provides the bifurcated leads and allows for the desired narrow gap spacing in the same manner as that of the etching process.

Although the invention has been shown and described with respect to a best mode embodiment thereof, it should be understood by those skilled in the art that various other changes, omissions, and additions in the form and detail thereof may be made therein without departing from the spirit and scope of the invention.

I claim:

1. The method of fabricating a lead frame assembly, having bifurcated conductors with outer lead end regions of first thickness joined to a common tie-bar and inner lead end regions extending inwardly at a second thickness less than the first thickness to the assembly center portion, from a precut metal foil workpiece having first and second major surfaces spaced apart at a workpiece thickness, comprising the steps of:

applying a first step hardened photoresist pattern to the first and second major surfaces of the workpiece to expose on the first major surface a first area corresponding in size to the sum area of the center portion, the conductor inner end regions, and the gaps between inner end regions of adjacent conductors, and to expose on the second major surface a first area corresponding to the sum area only of the center portion and to said inner end region gaps;

first step etching both major surfaces simultaneously to remove approximately one-quarter of the workpiece thickness from each exposed area;

removing said first step photoresist pattern and applying a second step hardened photoresist pattern to again expose said first area of the first major surface and to expose a second area of the first major surface corresponding in size to the area of the gaps between outer end regions of adjacent conductors, and to expose on the second major surface a second area likewise corresponding in size to the area of said outer end region gaps, in register with said second area of the first major surface; and second step etching both major surfaces simultaneously to remove one-half the workpiece material thickness from said exposed areas on each major surface, to provide the bifurcated conductor leadframe assembly.

2. The method of claim 1 wherein said foil workpiece comprises copper.

3. The method of claim 1, wherein said foil workpiece comprises iron-nickel alloy.

* * * * *